(12) United States Patent
Sunshine et al.

(10) Patent No.: US 10,844,524 B1
(45) Date of Patent: Nov. 24, 2020

(54) FORMING ELECTRICAL CONNECTIONS IN FABRIC-BASED ITEMS

(71) Applicant: Apple Inc., Cupertino, CA (US)

(72) Inventors: Daniel D. Sunshine, Sunnyvale, CA (US); Daniel A. Podhajny, San Jose, CA (US); David M. Kindlon, Lake Arrowhead, CA (US); Kathryn P. Crews, San Francisco, CA (US); Joseph B. Walker, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 509 days.

(21) Appl. No.: 15/146,726

(22) Filed: May 4, 2016

Related U.S. Application Data

(60) Provisional application No. 62/167,192, filed on May 27, 2015.

(51) Int. Cl.
| | | |
|---|---|---|
| *D03D 15/00* | (2006.01) | |
| *D03D 1/00* | (2006.01) | |
| *H05K 1/03* | (2006.01) | |
| *H05K 1/09* | (2006.01) | |
| *H05K 1/11* | (2006.01) | |

(Continued)

(52) U.S. Cl.
CPC ........... *D03D 15/00* (2013.01); *D03D 1/0082* (2013.01); *D03D 1/0088* (2013.01); *H05K 1/038* (2013.01); *H05K 1/0393* (2013.01); *H05K 1/09* (2013.01); *H05K 1/111* (2013.01); *H05K 3/0011* (2013.01); *H05K 3/10* (2013.01); *H05K 3/103* (2013.01); *D10B 2101/20* (2013.01);

(Continued)

(58) Field of Classification Search
CPC ........ H05K 3/103; H05K 1/0393; H05K 3/10; H05K 3/0011; H05K 1/038; H05K 1/111; H05K 1/09; H05K 2201/0145; H05K 2201/0154; H05K 2201/0158; D03D 15/00; D03D 1/0088; D03D 1/0082; D10B 2101/20
See application file for complete search history.

(56) References Cited

U.S. PATENT DOCUMENTS 4,755,659 A * 7/1988 Leon ................. B32B 17/10018
219/203
5,317,109 A * 5/1994 Aldissi ..................... H01R 4/18
174/82

(Continued)

*Primary Examiner* — Elizabeth C Imani
(74) *Attorney, Agent, or Firm* — Treyz Law Group, P.C.; Kendall W. Abbasi; Matthew R. Williams

(57) ABSTRACT

An item may include fabric or other materials formed from intertwined strands of material. The item may include circuitry that produces signals. The strands of material may include non-conductive strands and conductive strands. The conductive strands may carry the signals produced by the circuitry. Each conductive strand may have a strand core, a conductive coating on the strand core, and an insulating layer on the conductive coating. The strand cores may be strands formed from polymer. The conductive coating may be formed from metal. Electrical connections may be made between intertwined conductive strands by selectively removing portions of the outer insulating layer to expose the conductive cores of overlapping conductive strands. A conductive material such as solder or conductive epoxy may be applied to the exposed portions of the conductive cores to electrically and mechanically connect the overlapping conductive strands.

18 Claims, 11 Drawing Sheets

(51) Int. Cl.
*H05K 3/10* (2006.01)
*H05K 3/00* (2006.01)

(52) U.S. Cl.
CPC ............... *H05K 2201/0145* (2013.01); *H05K 2201/0154* (2013.01); *H05K 2201/0158* (2013.01)

(56) References Cited

U.S. PATENT DOCUMENTS

| | | | |
|---|---|---|---|
| 6,623,676 B1 * | 9/2003 | Davis | B29B 17/0042 264/112 |
| 7,022,917 B2 * | 4/2006 | Jung | D03D 1/0082 174/88 R |
| 8,800,136 B2 | 8/2014 | Perera et al. | |
| 2003/0189037 A1 | 10/2003 | Kochman et al. | |
| 2012/0030935 A1 | 2/2012 | Slade et al. | |
| 2012/0118427 A1 | 5/2012 | Brookstein et al. | |
| 2014/0306250 A1 * | 10/2014 | Gardner | H01L 25/0753 257/89 |

* cited by examiner

FORMING ELECTRICAL CONNECTIONS IN FABRIC-BASED ITEMS

This application claims the benefit of provisional patent application No. 62/167,192, filed May 27, 2015, which is hereby incorporated by reference herein in its entirety.

BACKGROUND

This relates generally to items formed from strands of material and, more particularly, to items formed from strands of material such as insulated conductive strands with conductive cores.

It may be desirable to form items such a bags, clothing, and other items from intertwined strands of material. For example, woven or knitted fabric or braided strands may be used in forming portions of an item.

In some situations, may be desirable for some or all of a strand of material in an item to be conductive. Conductive strands may be used, for example, to carry signals between circuitry in different portions of an item. Strands such as conductive strands may serve both mechanical functions (e.g., by forming a part of a fabric) and/or electrical functions (e.g., by conveying signals).

Challenges may arise when forming items such as fabric-based items with conductive strands. It is often desirable for conductive strands to exhibit good mechanical properties, such as high strength and flexibility. Because conductive strands may need to carry electrical signals, the resistance of a conductive strand should generally not be too high. Conductive strands should also be compatible with the non-conductive strands in a fabric and should not form undesired short circuits with surrounding structures. If care is not taken, conductive strands in a fabric-based item may be overly fragile, may exhibit poor signal carrying capabilities, may be insufficiently isolated from surrounding structures, or may adversely affect the appearance and feel of the item.

It would therefore be desirable to be able to provide strand-based items that incorporate improved conductive strands.

SUMMARY

An item may include fabric or other materials formed from intertwined strands of material. The item may include circuitry that produces signals. The strands of material may include non-conductive strands and conductive strands. Strands may be intertwined using weaving equipment, knitting equipment, braiding equipment, or other equipment for intertwining strands of material. If desired, the non-conductive strands and conductive strands may be close in size (e.g., to minimize or eliminate perceptible differences in the appearance and feel of the non-conductive and conductive strands).

The conductive strands may carry the signals produced by the circuitry. Each conductive strand may have a strand core, a conductive coating on the strand core, and an insulating coating on the conductive coating. The strand cores may be formed from polymers such as para-aramids and aromatic polyesters (as examples). The conductive coating may be formed from a metal such as silver or other metals. The insulating coating may be a relatively thin insulator such as an insulator with a thickness of less than 5 microns or other suitable thickness. Examples of materials that may be used for forming the insulator include polyvinyl formal, polyester-polyimide, polyamide-polyimide, polyamide, polyimide, polyester, polytetrafluoroethylene, polyurethane, and other polymers.

Polymer strand cores may be formed by extrusion, spinning, or other techniques. Metal coatings for the strand cores may be formed by electrochemical deposition or other metal deposition techniques. Insulating layers may be formed by applying liquid polymer in a thin layer to the exterior of a strand that has been coated with metal and by applying heat or otherwise curing the liquid polymer. In some arrangements, insulating layers may be formed from non-conductive strands that are wrapped (e.g., braided or twisted) around conductive cores.

Electrical connections may be made between intertwined conductive strands by selectively removing portions of the outer insulating layer to expose the conductive cores of overlapping conductive strands. A conductive material such as solder or conductive epoxy may be applied to the exposed portions of the conductive cores to electrically and mechanically connect the overlapping conductive strands.

DETAILED DESCRIPTION

Figure 1:
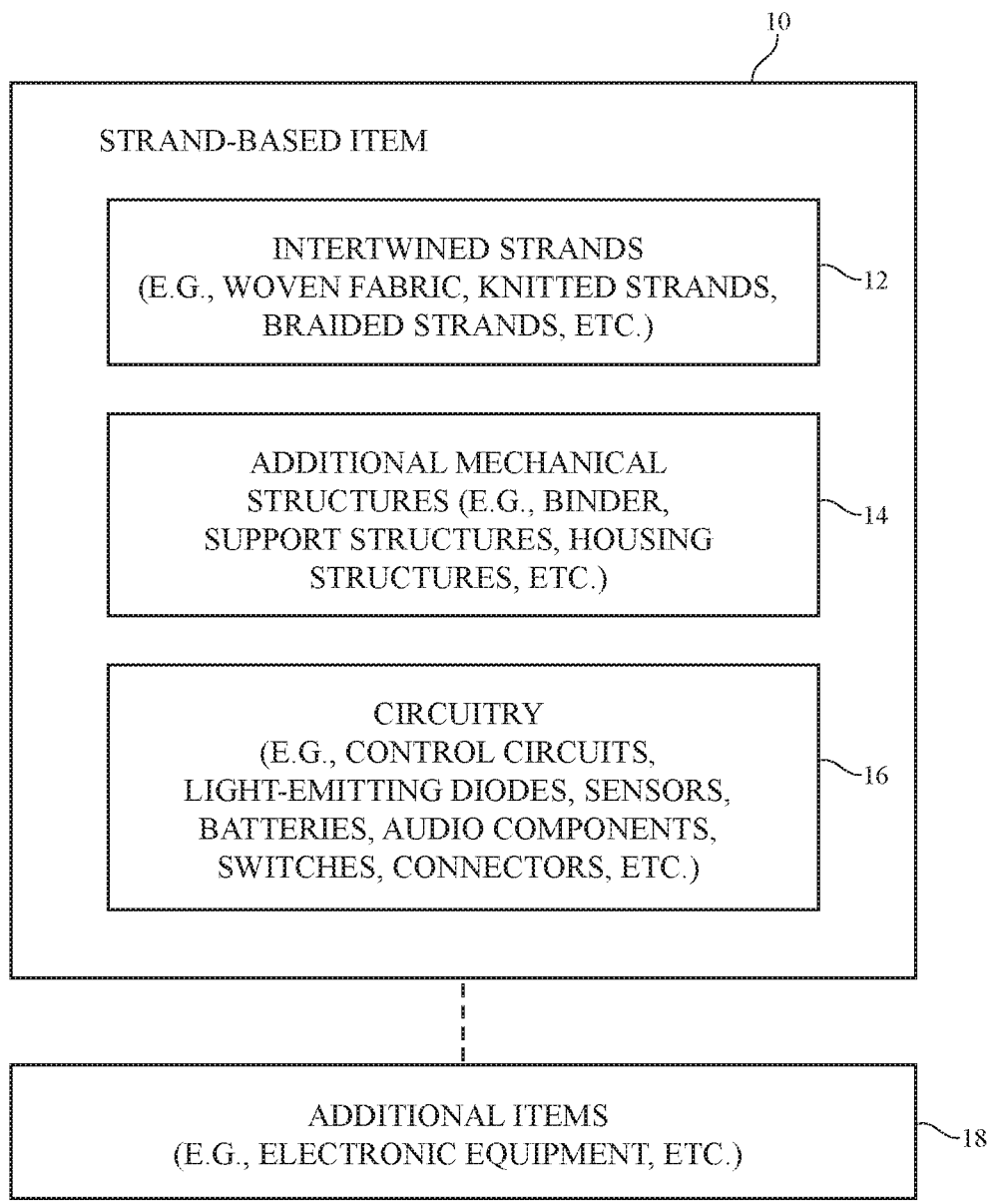
FIG. 1 is a schematic diagram of an illustrative item that may include strands of material in accordance with an embodiment.

Strands of material may be incorporated into strand-based items such as strand-based item 10 of FIG. 1. Item 10 may be an electronic device or an accessory for an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable strand-based item.

Strands in strand-based item 10 may form all or part of a housing wall for an electronic device, may form internal structures in an electronic device, or may form other strand-based structures. Strand-based item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

Item 10 may include intertwined strands 12. The strands may be intertwined using strand intertwining equipment such as weaving equipment, knitting equipment, braiding equipment, or equipment that intertwines strands by entangling the strands with each other in other ways (e.g., to form felt). Intertwined strands 12 may, for example, form woven or knitted fabric or other fabric (i.e., item 10 may be a fabric-based item), a braided cord, etc.

Strands 12 may be single-filament strands or may be threads, yarns, or other strands that have been formed by intertwining multiple filaments of material together. Strands 12 may be formed from polymer, metal, glass, graphite, ceramic, natural fibers such as cotton, bamboo, wool, or other organic and/or inorganic materials and combinations of these materials. Strands 12 may be insulating or conductive.

Conductive coatings such as metal coatings may be formed on non-conductive strands (e.g., plastic cores) to make them conductive and strands such as these may be coated with insulation or left bare. Reflective coatings such as metal coatings may be applied to strands 12 to make them reflective. Strands 12 may also be formed from single-filament metal wire, multifilament wire, or combinations of different materials.

Strands 12 may be conductive along their entire length or may have conductive segments (e.g., metal portions that are exposed by locally removing insulation or that are formed by adding a conductive layer to a portion of a non-conductive strand.). Threads and other multifilament yarns that have been formed from intertwined filaments may contain mixtures of conductive fibers and insulating fibers (e.g., metal strands or metal coated strands with or without exterior insulating layers may be used in combination with solid plastic fibers or natural fibers that are insulating).

Item 10 may include additional mechanical structures 14 such as polymer binder to hold strands 12 together, support structures such as frame members, housing structures (e.g., an electronic device housing), and other mechanical structures.

Circuitry 16 may be included in item 10. Circuitry 16 may include components that are coupled to strands 12, components that are housed within an enclosure formed by strands 12, components that are attached to strands 12 using welds, solder joints, adhesive bonds (e.g., conductive adhesive bonds), crimped connections, or other electrical and/or mechanical bonds. Circuitry 16 may include metal structures for carrying current, integrated circuits, discrete electrical components such as resistors, capacitors, and inductors, switches, connectors, light-emitting components such as light-emitting diodes, audio components such as microphones and speakers, vibrators, solenoids, piezoelectric devices, and other electromechanical devices, connectors, microelectromechanical systems (MEMs) devices, pressure sensors, light detectors, proximity sensors, force sensors, moisture sensors, temperature sensors, accelerometers, gyroscopes, compasses, magnetic sensors, touch sensors, and other sensors, components that form displays, touch sensors arrays (e.g., arrays of capacitive touch sensor electrodes to form a touch sensor that detects touch events in two dimensions), and other input-output devices. Circuitry 16 may also include control circuitry such as non-volatile and volatile memory, microprocessors, application-specific integrated circuits, system-on-chip devices, baseband processors, wired and wireless communications circuitry, and other integrated circuits.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with strand-based item 10 using a wired communications link or other connection that allows information to be exchanged.

In some situations, item 18 may be an electronic device such as a cellular telephone, computer, or other portable electronic device and strand-based item 10 may form a case or other structure that receives the electronic device in a pocket, an interior cavity, or other portion of item 10. In other situations, item 18 may be a wrist-watch device or other electronic device and item 10 may be a strap or other strand-based item that is attached to item 18. In still other situations, item 10 may be an electronic device, strands 12 may be used in forming the electronic device, and additional items 18 may include accessories or other devices that interact with item 10.

If desired, magnets and other structures in items 10 and/or 18 may allow items 10 and 18 to interact wirelessly. One item may, for example, include a magnet that produces a magnetic field and the other item may include a magnetic switch or magnetic sensor that responds in the presence of the magnetic field. Items 10 and 18 may also interact with themselves or each other using pressure-sensitive switches, pressure sensors, force sensors, proximity sensors, light-based sensors, interlocking electrical connectors, etc.

The strands that make up item 10 may be intertwined using any suitable strand intertwining equipment. For example, strands 12 may be woven together to form a fabric. The fabric may have a plain weave, a satin weave, a twill weave, or variations of these weaves, may be a three-dimensional woven fabric, or may be other suitable woven fabric. If desired, the strands that make up item 10 may be intertwined using knitting equipment, braiding equipment, or other strand intertwining equipment. Item 10 may also incorporate more than one type of fabric or intertwined strand-based material (e.g., item 10 may include both woven and knitted portions).

Figure 2:
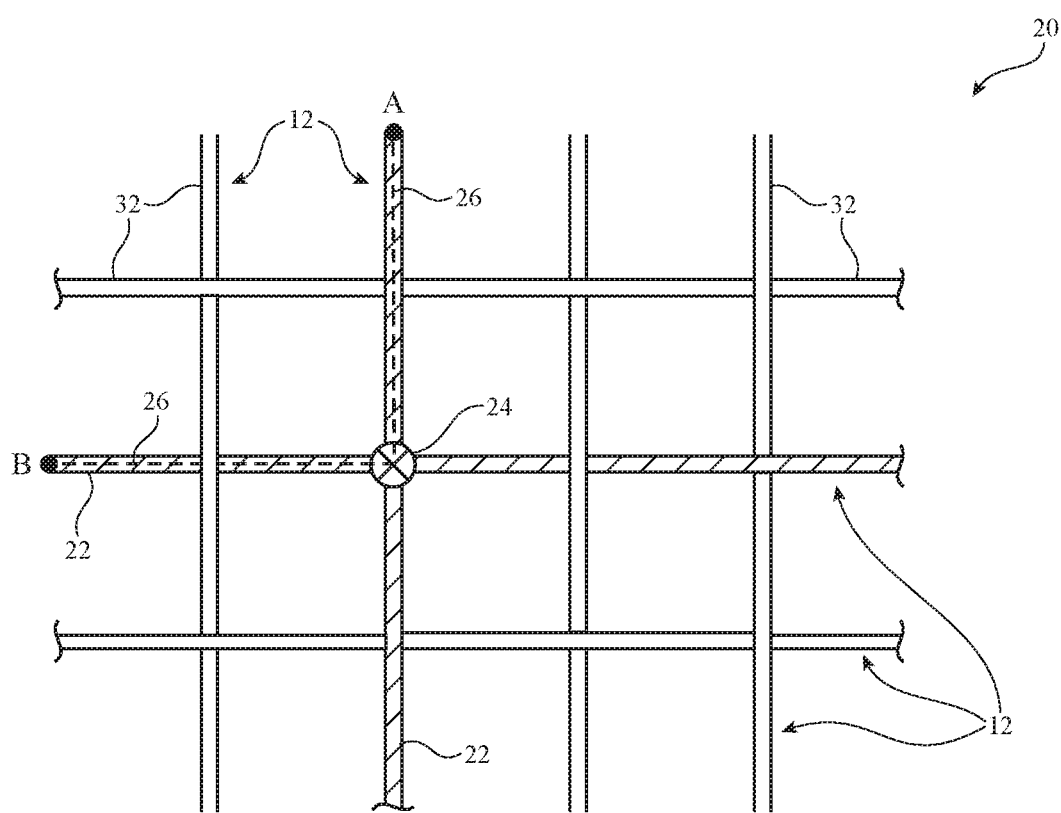
FIG. 2 is a diagram of a portion of a fabric with conductive strands in accordance with an embodiment.

The strands that make up item 10 may be intertwined to form a fabric such as illustrative fabric 20 of FIG. 2. Fabric 20 may include strands 12. Strands 12 may be formed from conductive and/or insulating materials. As an example, fabric may be formed from insulating strands 32 interspersed with conductive strands 22. In the illustrative configuration of FIG. 2, a first conductive strand 22 extends vertically and electrically connects node A with junction 24 and a second conductive strand 22 extends horizontally (i.e., perpendicular to the first conductive strand) and electrically connects node B with junction 24. At the intersection of the first and second conductive strands at junction 24, the first and second strands may be electrically connected using mechanical contact, solder, welds, conductive adhesive, a crimped metal connection or other metal connector, or other electrical connection structure. Using this type of technique, desired signal paths such as illustrative signal path 26 between nodes A and B may be formed within fabric 20 (e.g., to form signal busses, to form electrodes or other parts of sensors, to form other conductive structures, etc.).

Conductive strands such as conductive strands 22 in illustrative fabric 20 for item 10 may be formed from one or more layered materials. For example, conductive strand 22 may have a core (e.g., an elongated member such as a monofilament), a conductive inner coating, and an outer insulating coating.

The different portions of the conductive strand may be formed from different materials or, if desired, two or more of the portions of the conductive strand may be formed from the same material. As an example, a conductive strand may have a core and an outer coating that are formed from a common dielectric and that are separated by an intermediate layer formed from a conductive material. Configurations may also be used in which a conductive strand has a core formed from a first dielectric and an outer layer formed from a second dielectric and in which the first and second dielectrics are separated from each other by an intervening conductive layer such as a metal layer.

In some configurations, conductive strand 22 may contain polymer. For example, conductive strand 22 may contain a polymer core to provide strand 22 with strength and flexibility. Polymer may also be used in forming insulating outer coating layers. Examples of polymers that may be used in forming a core and/or an outer insulating coating for conductive strand 22 include polyamide (nylon—e.g., nylon6, nylon6,6, nylon 11), aromatic polyamide (i.e., para-aramids such as Kevlar® or other aramids), polyimide, polyester, polyolefin, acrylic, aromatic polyesters such as Vectran®, polyethylene, extruded cellulosic polymers such as rayon and Tencel®, polyvinyl formal, polyester-polyimide, poly-amide-polyimide, polytetrafluoroethylene, and polyurethane. Other polymers or mixtures of these polymers may be used, if desired. Inorganic materials may also be used in forming dielectric strand cores and insulating layers. Illustrative configurations in which these strand structures are formed from polymers are sometimes described herein as an example.

The polymer materials of strand 22 may be formed from conductive organic material, from insulating polymeric materials (e.g., materials to form a dielectric core and/or outer coating), from polymer that includes conductive filler such as particles of metal, particles of carbon nanotube material, graphene particles, fibrous carbon material, or other conductive particles. Conductive filler may be incorporated into the polymer in a concentration that renders a portion of strand 22 conductive or may be incorporated into the polymer in a lower concentration (e.g., to promote adhesion or otherwise enhance compatibility with other portions of strand 22 without necessarily increasing the conductivity of the polymer to a level that allows the material to serve as a conductive signal path in fabric 20).

In some situations, monofilaments may be formed of metal or polymer (i.e., polymer with conductive filler or without conductive filler). These monofilaments may be intertwined to form strands 22 or portions of strands 22. In general, strands 22 may have one or more materials, two or more materials, three or more materials, four or more materials, or five or more materials. The structures of strands 22 may incorporate conductive materials such as metal, insulating materials such as polymer, conductive organic materials such as conductive polymer, polymer filled with metal particles and other conductive filler, other materials, and/or combinations of these materials.

Figure 3:
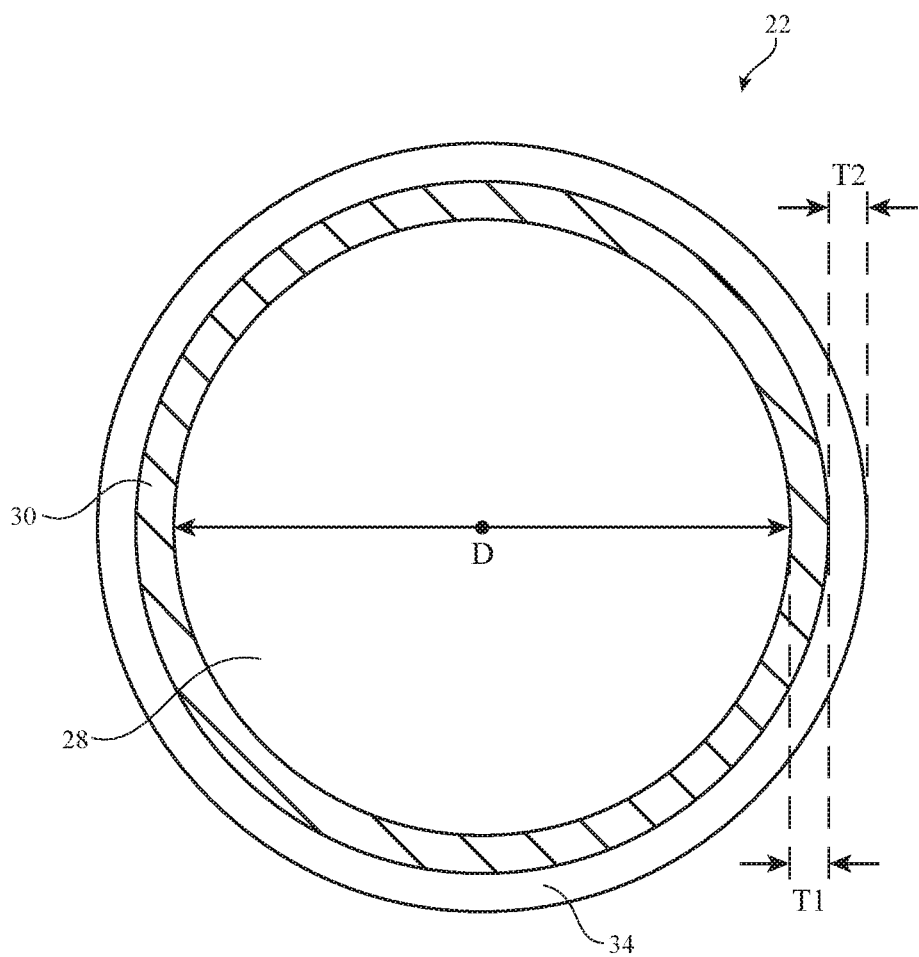
FIG. 3 is a cross-sectional side view of an illustrative conductive strand having a conductive core formed from polymer that is coated with conductive material in accordance with an embodiment.

A cross-sectional side view of illustrative strand 22 that may be used in fabric 20 is shown in FIG. 3. As shown in FIG. 3, conductive strand 22 may have core 28, conductive coating 30, and insulating coating 34. Core 28 of FIG. 3 has a circular cross-sectional shape, but core 28 may have other shapes if desired. Core 28 may be formed from para-aramid fiber (e.g., Kevlar®), spun aromatic polyester fiber (e.g., Vectran®), or other polymer fiber. Core 28 is preferably thermally stable (e.g., core 28 is preferably able to withstand exposure to elevated temperatures without incurring damage). The elevated temperatures may be, for example, temperatures of 200-300° C., more than 150° C., more than 250° C., more than 350° C., less than 250° C., 210-220° C., or other suitable temperatures. Core 28 also preferably has a high elastic modulus (Young's modulus), such as a modulus of 50-250 GPa, 50-150 GPa, 100-200 GPa, more than 50 GPa, less than 250 GPa, etc. If desired, core 28 may have other advantageous physical attributes such as being insensitive to degradation due to exposure to light, having a good abrasion resistance, being highly flexible, exhibiting a high strength-to-weight ratio, forming a good electrical insulator, etc.

To form fabrics and other intertwined strands with desired properties, it may be desirable for the diameter of core 28 to be relatively small. As an example, diameter D of core 28 may be 50-70 microns, 25-100 microns, less than 100 microns, less than 150 microns, more than 10 microns, 10-200 microns, 10-500 microns, 150-250 microns, more than 50 microns, less than 400 microns, or other suitable diameter. The linear mass density of core 28 may be 220 denier, 130 denier, 55 denier, 28 denier, less than 100 denier, less than 75 denier, 75-20 denier, 75-25 denier, less than 60 denier, 60-25 denier, more than 10 denier, more than 20 denier, or other suitable linear mass density.

Examples of metals that may be used in forming conductive coating 30 include gold, silver, copper, aluminum, nickel, palladium, molybdenum, platinum, titanium, and tungsten. Other metals may also be used in forming coating 30. The thickness T1 of conductive coating 30 may be 25 microns, more than 1 micron, more than 5 microns, less than 25 microns, less than 10 microns, less than 100 microns, 10-50 microns, 20-70 microns, more than 15 microns, more than 20 microns, less than 35 microns, less than 50 microns, less than 5 microns, or other suitable thickness. Coating 30 may be a metal (e.g., an elemental metal such as silver and/or a metal alloy) that has been deposited by electrochemical deposition, physical vapor deposition, etc. or may be any other suitable conductive layer.

Insulating coating 34 may have a thickness T2 of 1-2 microns, more than 0.5 microns, less than 3 microns, less than 4 microns, 0.4-5 microns, less than 5 microns, less than 10 microns, less than 15 microns, less than 20 microns, 0.2-10 microns, more than 0.7 microns, or other suitable thickness. Coating 34 may include one or more dielectric sublayers (e.g., one layer, two layers, three layers, four layers, or more than four layers). To ensure that strand 22 can withstand elevated temperatures, coating 34 is preferably able to withstand elevated temperatures (e.g., temperatures of 200-300° C., more than 150° C., more than 250° C., more than 350° C., less than 250° C., 210-220° C., or other suitable temperatures). Examples of insulating coating materials that may be used for coating 34 include polyvinyl formal, polyester-polyimide, polyamide-polyimide, polyamide, polyimide, polyester, polytetrafluoroethylene, and polyurethane (e.g., thermoplastic polyurethane). Other polymers or mixtures of these polymers may be used, if desired. In configurations in which coating layer 34 is formed from multiple sublayers, each sublayer may be formed from the same material or some or all of the sublayers may be formed from different materials.

Figure 4:
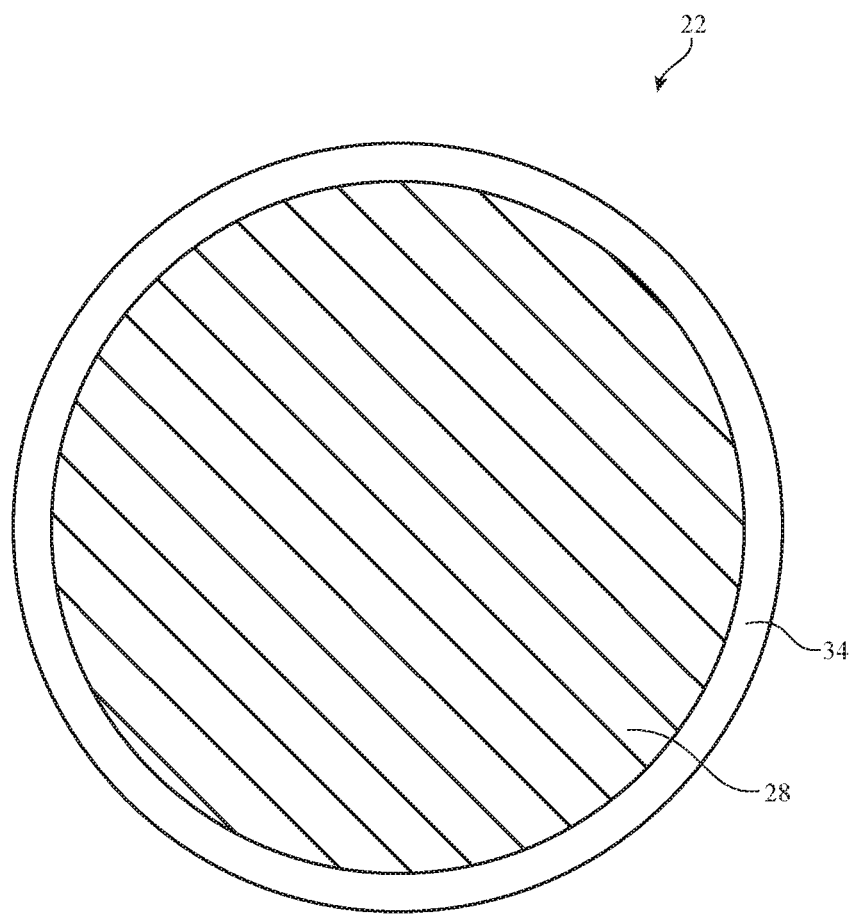
FIG. 4 is a cross-sectional side view of an illustrative conductive strand having a solid conductive core in accordance with an embodiment.

The example of FIG. 3 in which conductive strand 22 is formed from a polymer core surrounded by a conductive coating is merely illustrative. If desired, conductive strand 22 may include a solid conductive core as shown in FIG. 4. In the example of FIG. 4, strand 22 includes a conductive core 28 and an insulating coating 34. Core 28 of FIG. 4 may be formed from metal (e.g., steel, gold, silver, copper, aluminum, nickel, palladium, molybdenum, platinum, titanium, tungsten, or other suitable metal).

As used herein, "conductive core" may refer to a polymer core coated with conductive material of the type shown in FIG. 3 or a solid conductive core of the type shown in FIG. 4. Arrangements in which conductive strands 22 include a polymer core 28 coated with conductive material 30 are sometimes described herein as an example.

Figure 5:
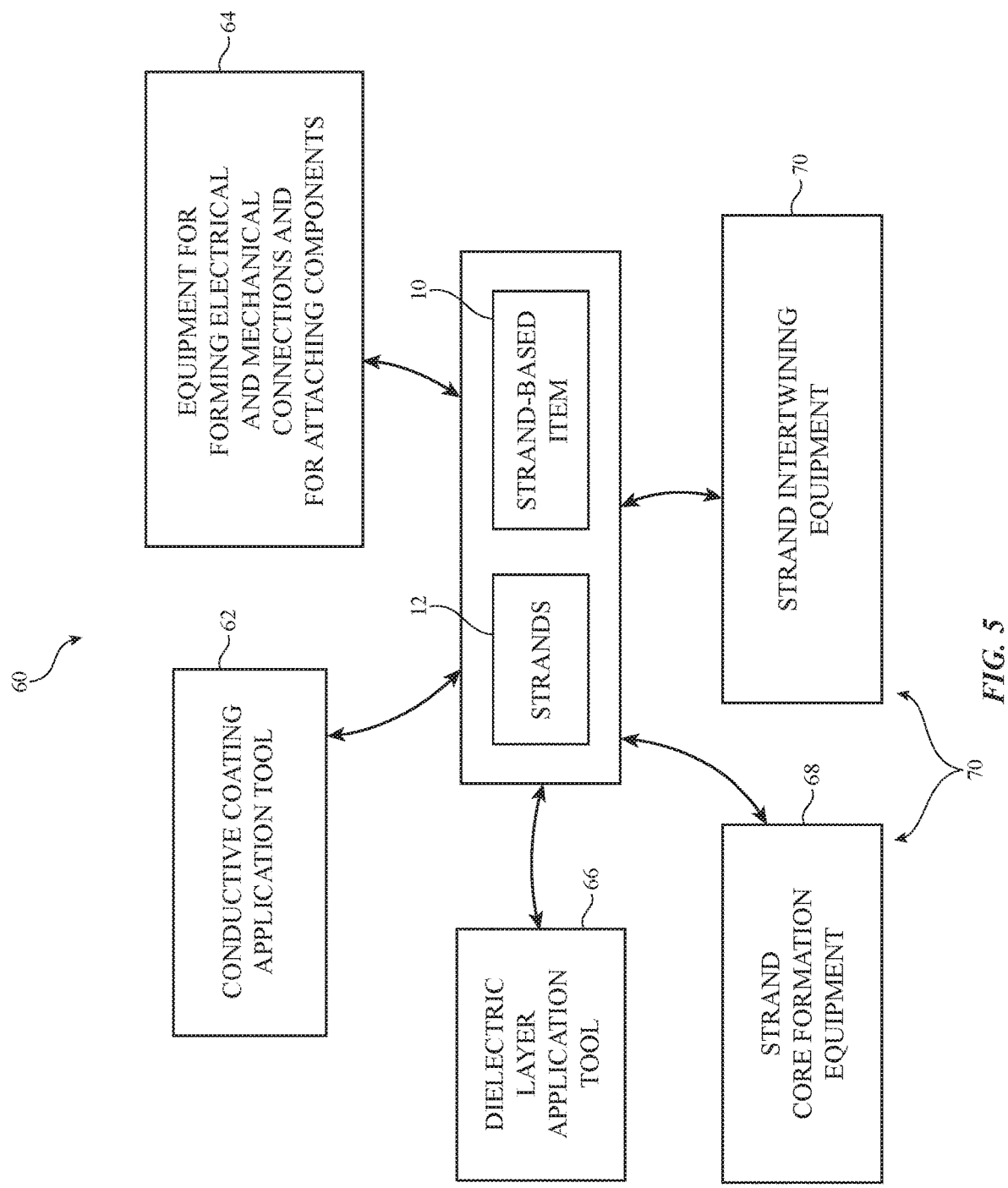
FIG. 5 is a diagram of illustrative equipment of the type that may be used in forming insulated conductive strands and strand-based items that include insulated conductive strands in accordance with an embodiment.

FIG. 5 is a diagram showing different types of equipment 60 that may be used in processing strands 12 (e.g., nonconductive strands 28 and conductive strands 22) and/or that may be used in processing strand-based item 10. As shown in FIG. 5, equipment 60 may include strand core formation equipment 68. Equipment 68 may include, for example, equipment for extruding and/or otherwise forming polymer cores for strands 12. Conductive coating application tool 62 may be used to apply one or more conductive coatings. For example, tool 62 may be used to apply a metal coating such as coating 30 to a polymer strand core such as core 28 to form a conductive strand 22. Dielectric coating application tool 66 may be used to apply a polymer layer or other insulating coating such as insulating coating 34. For example, tool 66 may be used to apply a thin polymer coating to the exposed metal coating on a polymer strand core, thereby forming an insulated conductive strand 22.

Equipment 64 may be used in processing strands 12. Equipment 64 may include a heat source (e.g., a flame, a heated metal structure or other heated structure, a lamp that produces heat, an oven, etc.). Equipment 64 may also include a laser, light-emitting diode, or other light source (e.g., an infrared laser or infrared light-emitting diode, a visible laser or visible light-emitting diode, and/or an ultraviolet laser or light-emitting diode). By applying heat or light or other energy to strands 12 or by using equipment 64 to mechanically or chemically remove material from strands 12, coatings can be selectively removed, liquid polymers and other coating materials may be cured, the texture of strand 12 may be altered, or other strand modifications can be made.

Equipment 64 may be used in attaching electrical components such as electrical components in circuitry 16 of FIG. 1 to strands such as conductive strands 22. For example, equipment 64 may be used to attach electrical components to strands 22 using solder joints, crimped metal connections, welds, conductive adhesive, or other conductive attachment structures. The electrical components that are attached to strands in this way may include light-emitting components, integrated circuits, light-emitting diodes, light-emitting diodes that are packaged with transistor-based circuitry such as communications circuitry and/or light-emitting diode driver circuitry that allows each component to operate as a pixel in a display, discrete components such as resistors, capacitors, and inductors, audio components such as microphones and/or speakers, sensors such as touch sensors (with or without co-located touch sensor processing circuitry), accelerometers, temperature sensors, force sensors, microelectromechanical systems (MEMS) devices, transducers, solenoids, electromagnets, pressure sensors, light-sensors, proximity sensors, buttons, switches, two-terminal devices, three-terminal devices, devices with four or more contacts, etc. Electrical connections for attaching electrical components to strands 12 using equipment 64 may be formed using solder, conductive adhesive, welds, molded package parts, mechanical fasteners, wrapped strand connections, press-fit connections, crimped connections (e.g., bend metal prong connections), and other mechanical connections, portions of liquid coatings (e.g., metallic paint, conductive adhesive, etc.) that are selectively applied to strands 12 using equipment 64, or using any other suitable arrangement for forming an electrical short between conductive structures.

Strand intertwining equipment 70 (e.g., weaving equipment, knitting equipment, braiding equipment, or other strand intertwining equipment) may be used in intertwining strands 12 to form fabric and other structures for strand-based item 10. Equipment 60 may be used to process strands 12 before, during, or after processing of strands 12 with equipment 70 to form item 10.

Figure 6:
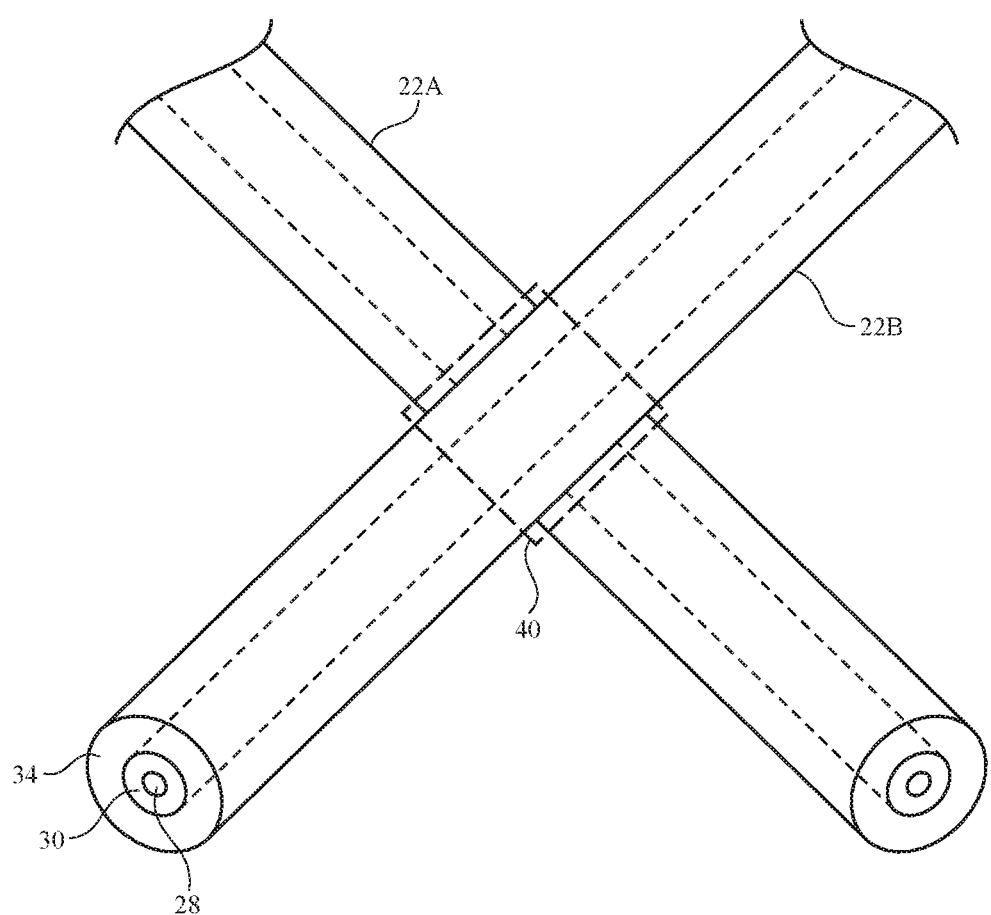
FIG. 6 is a perspective view of illustrative insulated conductive strands that may be electrically connected in accordance with an embodiment.

To form electrical connections with conductive strands 22, it may be desirable to selectively remove portions of outer insulating layer 34 to expose conductive coating 30. FIG. 6 is a perspective view of intertwined strands 22A and 22B showing an illustrative region 40 where an electrical connection may be formed with one or both of strands 22A and 22B. In some arrangements, it may be desirable to electrically connect the conductive cores of strand 22A and strand 22B at region 40. In other arrangements, it may be desirable to electrically connect a component or bond pad to one or both of strands 22A and 22B in region 40.

To electrically connect the conductive material 30 of strand 22A with the conductive material 30 of strand 22B, outer insulating coating 34 may be removed from strand 22A and 22B in region 40. A conductive material such as solder, conductive epoxy, conductive ink, or other suitable conductive material may be used to electrically connect exposed conductive layer 30 of strand 22A to the exposed conductive layer 30 of strand 22B.

Figure 7A:
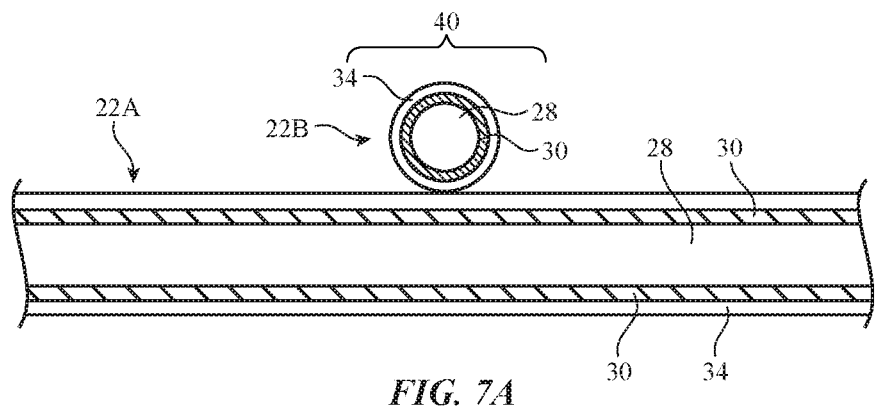
FIGS. 7A, 7B, and 7C are cross-sectional side views of illustrative conductive strands showing how the conductive strands may be electrically connected in accordance with an embodiment.
Figure 7B:
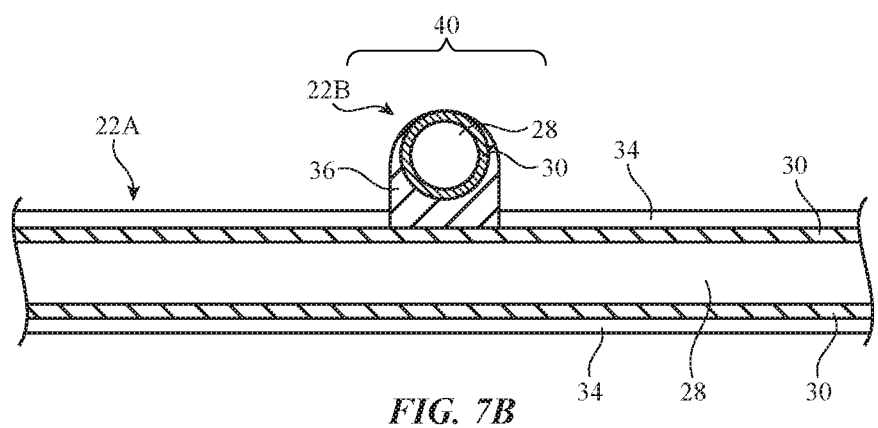
Figure 7C:
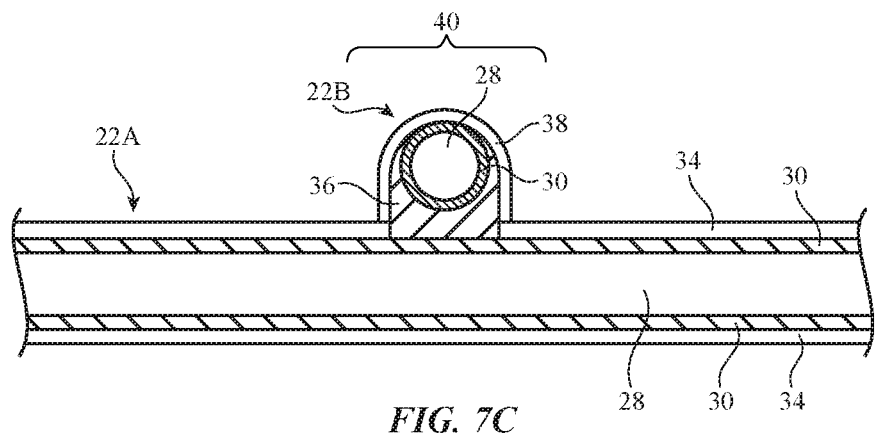

FIGS. 7A, 7B, and 7C show illustrative steps involved in electrically and mechanically connecting conductive layer 30 of strand 22A with conductive layer 30 of strand 22B. As shown in FIG. 7A, strands 22A and 22B each have a conductive core formed from core 28 coated with conductive material 30. The conductive cores of strands 22A and 22B are insulated with dielectric coating 34. At this stage, dielectric coating 34 in region 40 separates conductive layer 30 of strand 22A from conductive layer 30 of strand 22B in region 40.

To electrically connect conductive layer 30 of strand 22A and conductive layer 30 of strand 22B, dielectric coating 34 on strands 22A and 22B in region 40 may be selectively removed to expose metal 30 in region 40. If desired, equipment such as equipment 64 of FIG. 5 may be used to selectively remove dielectric coating 34 in region 40. Dielectric coating may be removed by applying heat (e.g., from a flame, a heated metal structure or other heated structure, a lamp that produces heat, an oven, etc.), light (e.g., from an infrared laser or infrared light-emitting diode, a visible laser or visible light-emitting diode, and/or an ultraviolet laser or light-emitting diode), or chemicals (e.g., to chemically remove material 34 from strands 22A and 22B). By applying heat or light or other energy to strands 22 or by using equipment 64 to mechanically or chemically remove material from strands 22, coating 34 can be selectively removed from strands 22 in regions where access to the conductive core of strands 22 is desired.

As shown in FIG. 7B, conductive material 36 may be formed on exposed metal 30 of strands 22A and 22B in region 40 to thereby electrically connect metal layer 30 of strand 22A with metal layer 30 of strand 22B. Material 36 may be solder, conductive epoxy, conductive ink, or other suitable conductive material.

If desired, other methods of electrically connecting exposed metal 30 of strand 22A with exposed metal 30 of strand 22B may be used. For example, electrical and mechanical connections in regions such as region 40 may be formed using solder, conductive adhesive, welds, molded package parts, mechanical fasteners, wrapped strand connections, press-fit connections, crimped connections (e.g., bend metal prong connections), and other mechanical connections, portions of liquid coatings (e.g., metallic paint, conductive adhesive, etc.) that are selectively applied to strands 12 using equipment 64, or using any other suitable arrangement for forming an electrical short between metal 30 of strand 22A and metal 30 of strand 22B.

If desired, equipment 64 of FIG. 5 may be used in forming electrical connection structure 36. Equipment 64 may, for example, include a pick-and-place tool for depositing solder or other conductive materials in region 40.

In some arrangements, electrical connection structure 36 may be formed without removing dielectric coating 34. For example, a low-viscosity conductive material (e.g., a conductive ink or other conductive material with low viscosity) may be deposited on dielectric layer 34 in region 40 and may seep into dielectric layer 34 to form conductive structure 36. In this way, an electrical connection may be formed between metal 30 of strand 22A and metal 30 of strand 22B using a conductive portion 36 of dielectric coating 34.

If desired, region 40 of strands 22A and 22B may be sealed or encapsulated to protect the electrical connection and prevent contaminants or abrasive materials from compromising the connection between metal 30 of strand 22A and metal 30 of strand 22B. As shown in FIG. 7C, for example, encapsulation layer 38 may be formed over conductive structure 36 to form a seal around the electrical connection between strands 22A and 22B. Examples of materials that may be used in forming encapsulation layer 38 include epoxy, silicone, urethane, polyurethane (e.g., thermoplastic polyurethane), acrylic, polyester, other polymers, or other suitable materials. The use of sealant, encapsulation, or potting material in regions 40 may increase the robustness of the electrical and mechanical connection at junction 40 and may provide a watertight seal that prevents moisture and other contaminants from seeping into or between strands 22 in region 40. Metal 30 of strand 22A and core 28 of strand 22A may extend continuously through region 40. Encapsulation layer 38 may cover strands 22A and 22B in region 40. Insulating coating 34 of strand 22A and insulating coating 34 of strand 22B may extend outside region 40.

Figure 8:
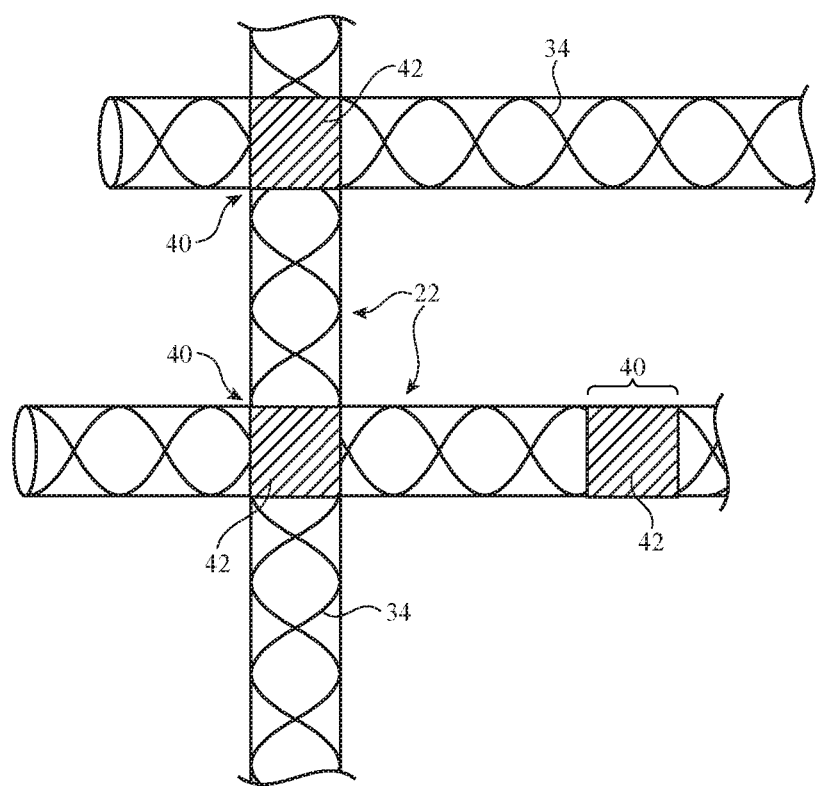
FIG. 8 is a top view of illustrative conductive strands that may include bond regions where bond pads are electrically connected to the conductive cores of the conductive strands in accordance with an embodiment.

In addition to forming electrical shorts between conductive cores of intertwined strands 22, it may be desirable to expose conductive cores of strands 22 in order to form electrical connections between an electronic component and a conductive strand 22. In order to mount electronic components to conductive strands 22, equipment 64 may be used to electrically connect bond pads to the conductive cores of strands 22. FIG. 8 is a top view of intertwined conductive strands 22 showing how bond pads 42 may be formed on conductive strands 22.

Bond pads 42 may be formed by selectively removing portions of outer insulating layer 34 in regions 40, applying conductive material 36 such as solder to the exposed portions of metal layer 30 in regions 40, and forming bond pads 42 on conductive material 36. If desired, conductive material 36 may be used to form bond pads 42 or bond pads 42 may be formed separately from material 36.

In other arrangements, bond pads 42 may be formed without removing dielectric layer 34. For example, a low-viscosity conductive material (e.g., a conductive ink or other conductive material with low viscosity) may be deposited on dielectric layer 34 in regions 40 and may seep into dielectric layer 34 to form bond pads 42 or to form a conductive structure on which bond pads 42 are formed. In this way, bond pads 42 may be electrically connected to the conductive core of strands 22 using a conductive portion of dielectric layer 34.

Figure 9:
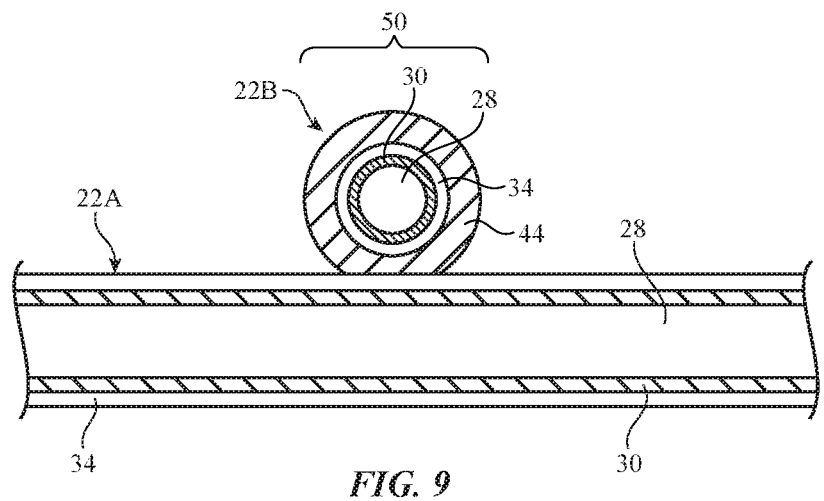
FIG. 9 is a cross-sectional side view of illustrative conductive strands that may include shielding in accordance with an embodiment.

In some scenarios, it may be desirable to apply conductive materials to strands 22 without shorting the conductive materials to the conductive cores of strands 22. As shown in FIG. 9, for example, it may be desirable to provide strands 22 with shielding layers such as shielding layer 44. Shielding layer 44 may be formed from layer of conductive material such as metal or conductive polymer that surrounds or partially surrounds strand 22 in region 50. Shielding layer 44 may be separated from interior metal layer 30 by insulating layer 34. Shielding layer 44 may be kept at a ground potential while metal layer 30 is used to convey electrical signals. If desired, shielding layer 44 and metal layer 30 may form a coaxial structure in which outer conductor 44 and inner conductor 30 share a common longitudinal axis.

Figure 10:
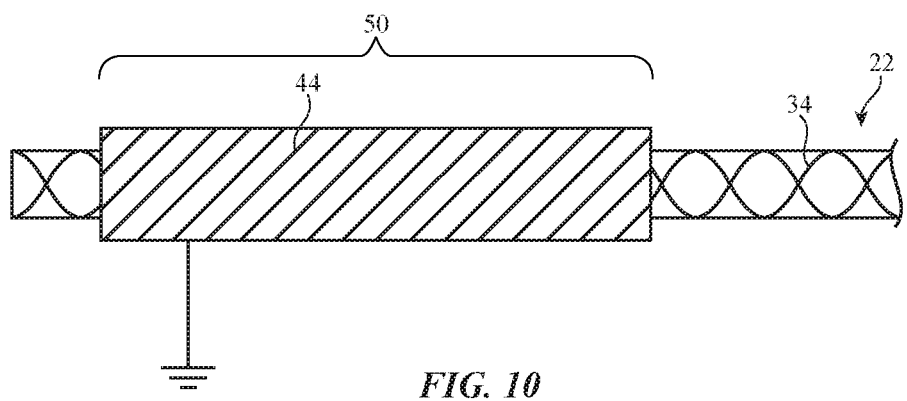
FIG. 10 is a cross-sectional side view of an illustrative conductive strand over which a ground plane structure is formed in accordance with an embodiment.

FIG. 10 is a top view of another suitable arrangement in which conductive structure 44 extends over a portion 50 of conductive strand 22. Conductive structure 44 may be used for shielding and/or may form a ground plane (e.g., for an antenna or other electronic component).

Figure 11:
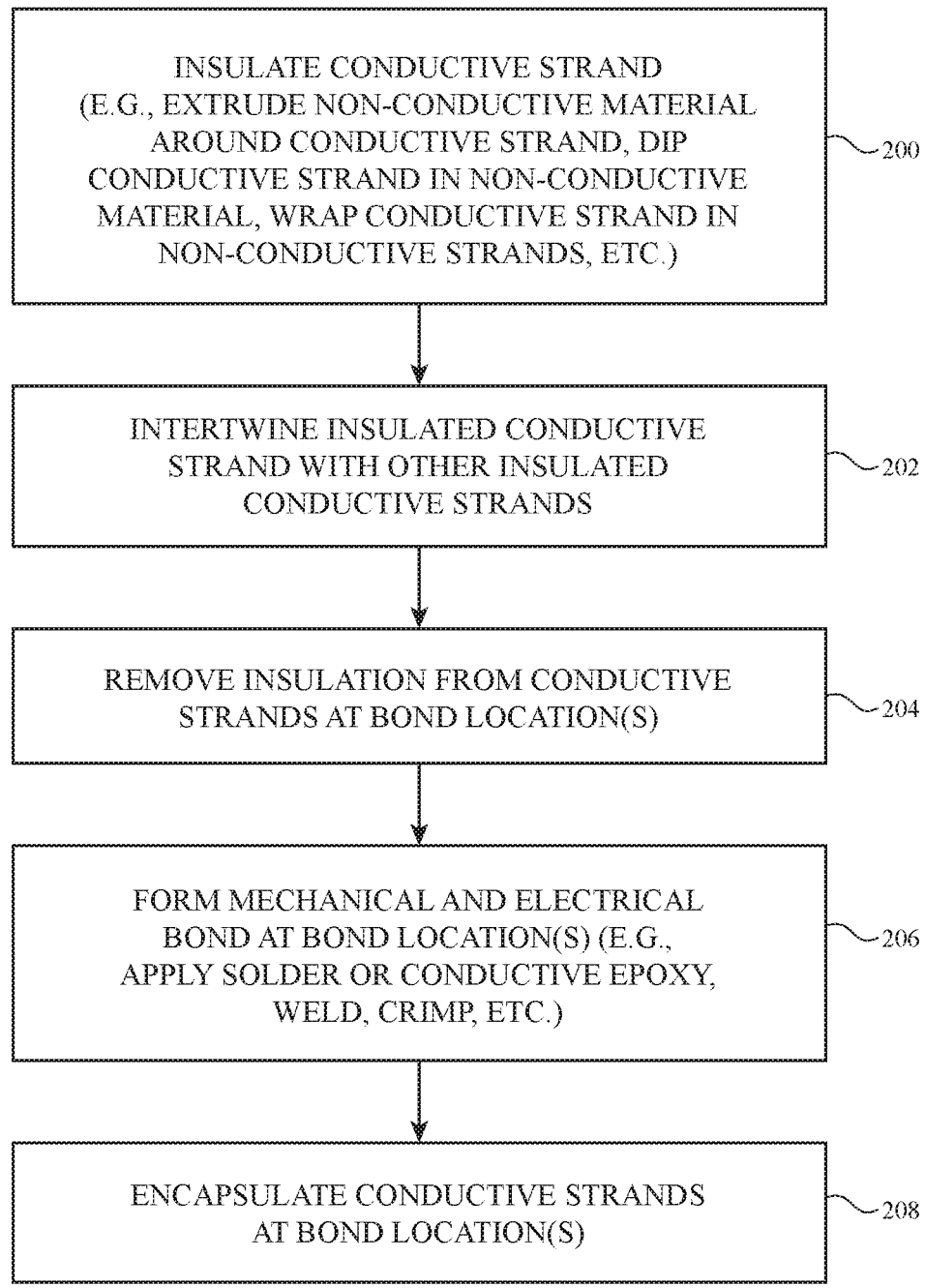
FIG. 11 is a flow chart of illustrative steps involved in forming electrical connections with insulated conductive strands in accordance with an embodiment.

FIG. 11 is a flow chart of illustrative steps involved in forming electrical connections with insulated conductive strands 22.

At step 200, dielectric layer application equipment 66 may be used to form dielectric outer coating 34 on layer 30, thereby forming conductive strand 22. If desired, multiple strands may be braided together (e.g., 5-10 strands, more than 3 strands, fewer than 12 strands, etc.) to form a thread or other strand that contains multiple smaller strands. These smaller strands may be insulating and/or conductive strands. Insulating layer 34 may be formed by applying a liquid polymer coating with a relatively thin thickness and curing the applied coating using heat or light to produce cured coating 34 (e.g., a coating having a thickness of less than 5 microns or other suitable thickness). In other arrangements, insulating layer 34 may be formed by extruding non-conductive material around a conductive core, dipping a conductive core in a non-conductive material, or wrapping a conductive core in non-conductive strands (e.g., such that the conductive core is surrounded by twisted or braided non-conductive strands).

At step 202, intertwining equipment 70 may be used to intertwine strands 12 to form a strand-based material. The strands that are intertwined in step 202 may include conductive strands, non-conductive strands, insulated conductive strands, and/or conductive strands without insulation.

At step 204, equipment 64 of FIG. 5 may be used to remove insulating layer 34 in regions where an electrical connection is to be made. For example, insulating layer 34 may be removed from regions 40 where an electrical connection is to be made between the conductive cores of overlapping conductive strands (e.g., as shown in FIGS. 7A, 7B, and 7C), or insulating layer 34 may be removed from regions 40 where an electrical connection is to be made between an electronic component and a conductive strand (e.g., as shown in FIG. 8). Equipment 64 may include a heat source (e.g., a flame, a heated metal structure or other heated structure, a lamp that produces heat, an oven, etc.). Equipment 64 may also include a laser, light-emitting diode, or other light source (e.g., an infrared laser or infrared light-emitting diode, a visible laser or visible light-emitting diode, and/or an ultraviolet laser or light-emitting diode). By applying heat or light or other energy to strands 22 to mechanically or chemically remove insulating material 34 from strands 22, conductive layer 30 in strands 22 can be selectively exposed in regions 40 where an electrical connection is to be made.

At step 206, conductive material such as conductive material 36 may be applied to the exposed conductive portions of strands 22. Material 36 may be solder, conductive epoxy, conductive ink, or other suitable conductive material. If desired, other methods of forming electrical connections with the exposed metal of strands 22 may be used. For example, electrical and mechanical connections in regions of exposed conductor may be formed using solder, conductive adhesive, welds, molded package parts, mechanical fasteners, wrapped strand connections, press-fit connections, crimped connections (e.g., bend metal prong connections), and other mechanical connections, portions of liquid coatings (e.g., metallic paint, conductive adhesive, etc.) that are selectively applied to strands 22 using equipment 64, or any other suitable arrangement for forming an electrical connection with exposed conductor on strands 22. The conductive material applied in step 206 may electrically connect the conductive cores of two overlapping strands and/or may be used to form a bond pad on the exposed conductor of strand 22.

At optional step 208, bond locations 40 may be sealed or encapsulated to protect the electrical connection and prevent contaminants or abrasive materials from compromising the connection to exposed conductor 30 or conductive structure 36. The encapsulation layer may, for example, be formed over conductive structure 36 to form a seal around the electrical connection between two overlapping strands 22 (e.g., as shown in FIG. 7C). Examples of materials that may be used in forming encapsulation layer 38 include epoxy, silicone, urethane, polyurethane (e.g., thermoplastic polyurethane), acrylic, polyester, other polymers, or other suitable materials.

Figure 12:
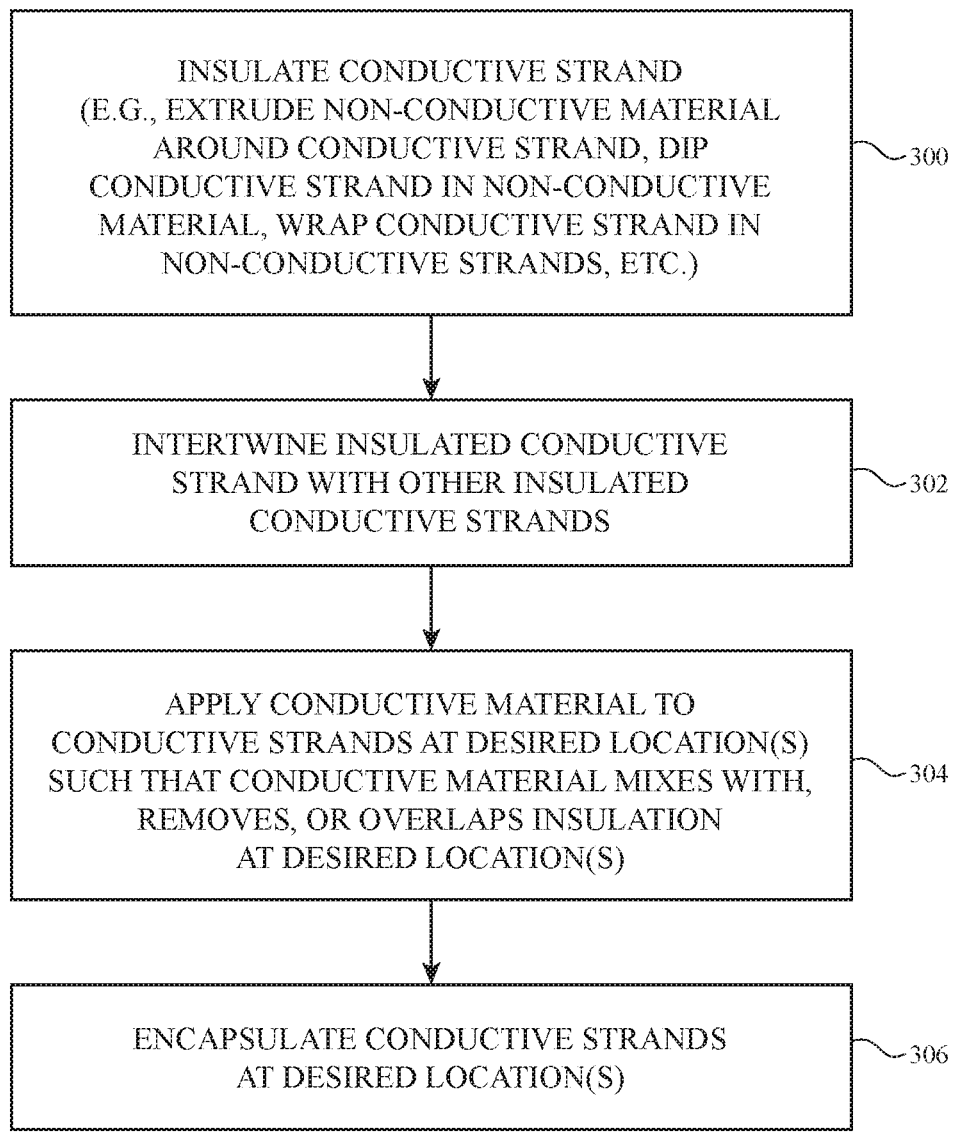
FIG. 12 is a flow chart of illustrative steps involved in forming conductive structures on insulated conductive strands in accordance with an embodiment.

The example of FIG. 11 in which insulating layer 34 is removed prior to applying conductive material 36 is merely illustrative. FIG. 12 is a flow chart of illustrative steps involved in forming conductive structures on strands 22 by applying conductive material 36 prior to or without removing insulating layer 34.

At step 300, dielectric layer application equipment 66 may be used to form dielectric outer coating 34 on layer 30, thereby forming conductive strand 22. If desired, multiple strands may be braided together (e.g., 5-10 strands, more than 3 strands, fewer than 12 strands, etc.) to form a thread or other strand that contains multiple smaller strands. These smaller strands may be insulating and/or conductive strands. Insulating layer 34 may be formed by applying a liquid polymer coating with a relatively thin thickness and curing the applied coating using heat or light to produce cured coating 34 (e.g., a coating having a thickness of less than 5 microns or other suitable thickness). In other arrangements, insulating layer 34 may be formed by extruding non-conductive material around a conductive core, dipping a conductive core in a non-conductive material, or wrapping a conductive core in non-conductive strands (e.g., such that the conductive core is surrounded by twisted or braided non-conductive strands).

At step 302, intertwining equipment 70 may be used to intertwine strands 12 to form a strand-based material. The strands that are intertwined in step 202 may include conductive strands, non-conductive strands, insulated conductive strands, and/or conductive strands without insulation.

At step 304, conductive material such as conductive material 36 may be applied to the desired portions of strands 22. For example, conductive material 36 may be applied to regions 40 where an electrical connection is to be made between the conductive cores of overlapping conductive strands (e.g., as shown in FIGS. 7A, 7B, and 7C), conductive material 36 may be applied to regions 40 where an electrical connection is to be made between an electronic component and a conductive strand (e.g., as shown in FIG. 8), or conductive material 36 may be applied to regions where shielding or grounding is desired (e.g., regions 50 of FIGS. 9 and 10). This may include, for example, using a pick-and-place tool to deposit solder that heats and thereby removes layer 34. In other arrangements, conductive material 36 may be a low-viscosity conductive ink that seeps into or mixes with dielectric layer 34 to form a conductive portion in dielectric layer 34. If shielding or grounding is desired, conductive structure 44 (FIGS. 9 and 10) may be formed over dielectric layer 34 such that dielectric layer 34 separates conductor 30 from conductor 44. With this type of arrangement, conductive material 44 may be formed from a material that does not penetrate or remove dielectric layer 34 (e.g., a viscous conductive ink, a metal coating, or other suitable conductive material).

At optional step 306, locations where conductive material 36 has been applied may be sealed or encapsulated to protect the conductive material from contaminants and prevent abrasive materials from comprising the connection to exposed conductor 30 or conductive structure 36. The encapsulation layer may, for example, be formed over conductive structure 36 to form a seal around the electrical connection between two overlapping strands 22 (e.g., as shown in FIG. 7C). Examples of materials that may be used in forming encapsulation layer 38 include epoxy, silicone, urethane, polyurethane (e.g., thermoplastic polyurethane), acrylic, polyester, other polymers, or other suitable materials.

The foregoing is merely illustrative and various modifications can be made by those skilled in the art without departing from the scope and spirit of the described embodiments. The foregoing embodiments may be implemented individually or in any combination.

What is claimed is:

1. Intertwined strands of material, comprising:
   non-conductive strands;
   first and second overlapping conductive strands that are intertwined with the non-conductive strands, wherein the first and second conductive strands each have an insulating coating formed on a conductive inner portion, wherein the conductive inner portions of the first and second conductive strands each have an exposed portion in a region, wherein the first conductive strand overlaps the second conductive strand, wherein the conductive inner portions of the first and second conductive strands each comprise a conductive coating formed on an outer surface of a dielectric core, and wherein the conductive coating and the dielectric core extend continuously through the region;
   a conductive material that electrically connects the exposed portion of the conductive inner portion of the first conductive strand to the exposed portion of the conductive inner portion of the second conductive strand, wherein the conductive material is interposed between the exposed portion of the conductive inner portion of the first conductive strand and the exposed portion of the conductive inner portion of the second conductive strand; and
   an encapsulation layer that seals the conductive material and the exposed portions of the conductive inner portions of the first and second conductive strands, wherein the encapsulation layer covers the first and second conductive strands in the region and the insulating coating on each conductive strand extends outside the region.

2. The intertwined strands of material defined in claim 1 wherein the conductive coating comprises metal.

3. The intertwined strands of material defined in claim 1 wherein the conductive coating comprises silver.

4. The intertwined strands of material defined in claim 1 wherein the dielectric core comprises a polymer.

5. The intertwined strands of material defined in claim 4 wherein the polymer is selected from the group consisting of: polyamide, aromatic polyamide, polyimide, polyester, polyolefin, acrylic, aromatic polyesters, polyethylene, cellulosic polymer, and polyurethane.

6. The intertwined strands of material defined in claim 4 wherein the polymer is a para-aramid.

7. The intertwined strands of material defined in claim 4 wherein the polymer is an aromatic polyester.

8. The intertwined strands of material defined in claim 1 wherein the insulating coating comprises thermoset polyurethane.

9. The intertwined strands of material defined in claim 1 wherein the conductive material comprises solder that mechanically and electrically connects the conductive inner portions of the first and second conductive strands.

10. The intertwined strands of material defined in claim 1 wherein the conductive material comprises conductive epoxy that mechanically and electrically connects the conductive inner portions of the first and second conductive strands.

11. A fabric-based item, comprising:
    circuitry; and
    intertwined strands of material including conductive strands that carry signals for the circuitry and non-conductive strands, wherein the conductive strands each have a polymer strand core, a metal coating on the polymer strand core, and an outer coating on the metal coating, wherein the outer coating of a first conductive strand in the conductive strands comprises an insulating portion that includes a dielectric material and a conductive portion that includes the dielectric material and a conductive material and wherein the conductive portion of the outer coating of the first conductive strand in the conductive strands forms an electrical connection between the first conductive strand and a second conductive strand in the conductive strands.

12. The fabric-based item defined in claim 11 wherein the conductive material comprises conductive ink.

13. The fabric-based item defined in claim 11 wherein the dielectric material comprises a material selected from the group consisting of: polyvinyl formal, polyester-polyimide, polyamide-polyimide, polyamide, polyimide, polyester, polytetrafluoroethylene, and polyurethane.

14. A fabric-based item, comprising:
    circuitry; and
    intertwined strands, wherein the intertwined strands comprise:
       insulating strands;
       a first conductive strand that has a first polymer strand core, a first metal coating on the polymer strand core that carries first signals for the circuitry, a first insulating coating on the first metal coating, and a metal coating shielding layer on the first insulating coating; and
       a second conductive strand that has a second polymer strand core, a second metal coating on the polymer strand core that carries second signals for the circuitry, and a second insulating coating on the second metal coating, wherein the second conductive strand overlaps the first conductive strand.

15. The fabric-based item defined in claim 14, wherein the metal coating shielding layer is coaxial with the first metal coating.

16. The fabric-based item defined in claim 14, wherein the metal coating shielding layer forms a ground plane for an antenna.

17. The fabric-based item defined in claim 14, wherein the metal coating shielding layer is in contact with the second insulating coating.

18. The intertwined strands of material defined in claim 1 wherein the insulating coating comprises thermoplastic polyurethane.

* * * * *